US011228128B2

(12) United States Patent
Fujita et al.

(10) Patent No.: US 11,228,128 B2
(45) Date of Patent: Jan. 18, 2022

(54) SPRING ELECTRODE

(71) Applicant: Mitsubishi Electric Corporation, Tokyo (JP)

(72) Inventors: Shigeto Fujita, Tokyo (JP); Yoshikazu Yaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/624,760

(22) PCT Filed: Aug. 28, 2017

(86) PCT No.: PCT/JP2017/030715
§ 371 (c)(1),
(2) Date: Dec. 19, 2019

(87) PCT Pub. No.: WO2019/043753
PCT Pub. Date: Mar. 7, 2019

(65) Prior Publication Data
US 2020/0412046 A1 Dec. 31, 2020

(51) Int. Cl.
*H01L 23/66* (2006.01)
*H01R 13/24* (2006.01)
*H01L 23/48* (2006.01)

(52) U.S. Cl.
CPC .............. *H01R 13/24* (2013.01); *H01L 23/48* (2013.01); *H01L 23/66* (2013.01); *H01L 2223/6605* (2013.01)

(58) Field of Classification Search
CPC .................. H01L 2224/72; H01L 2224/90
See application file for complete search history.

(56) References Cited

U.S. PATENT DOCUMENTS

| 3,231,795 A | * | 1/1966 | Steinhelper, Jr. | ..... H01L 23/051 257/727 |
| 4,800,888 A | * | 1/1989 | Itil | ..... A61B 5/291 600/383 |
| 5,354,541 A | * | 10/1994 | Sali | ..... B01J 19/088 422/186.07 |
| 6,320,268 B1 | | 11/2001 | Lang et al. | |

(Continued)

FOREIGN PATENT DOCUMENTS

| JP | 2000223658 A | 8/2000 |
| JP | 2004528724 A | 9/2004 |

OTHER PUBLICATIONS

International Search Report issued in PCT/JP2017/030715; dated Nov. 7, 2017.

(Continued)

*Primary Examiner* — Nicholas J Tobergte
(74) *Attorney, Agent, or Firm* — Studebaker & Brackett PC

(57) ABSTRACT

The object is to provide a technology that can prevent a spring electrode from being dissolved and broken upon a short circuit in a semiconductor chip. A spring electrode includes a main body. The main body is a tubular conductor, and varies in diameter in a longitudinal direction so that a side surface has bellows. Since the main body of the spring electrode does not include an edge portion, the local concentration of a short-circuit current that flows through the spring electrode upon a short circuit in a semiconductor chip can be reduced. This can prevent the spring electrode from being dissolved and broken.

8 Claims, 7 Drawing Sheets

(56) References Cited

U.S. PATENT DOCUMENTS

| | | | |
|---|---|---|---|
| 7,186,122 B2* | 3/2007 | Haga | H01R 13/03 |
| | | | 439/82 |
| 7,442,560 B2* | 10/2008 | Asada | H01R 13/035 |
| | | | 438/17 |
| 2004/0074763 A1* | 4/2004 | Okase | C25D 17/06 |
| | | | 204/230.3 |
| 2004/0207070 A1 | 10/2004 | Kaufmann et al. | |
| 2012/0196062 A1* | 8/2012 | Sato | F03G 7/005 |
| | | | 428/35.2 |
| 2020/0152595 A1* | 5/2020 | Fujita | H01L 23/62 |

OTHER PUBLICATIONS

An Office Action; "Notice of Reasons for Refusal," mailed by the Japanese Patent Office dated May 26, 2020, which corresponds to Japanese Patent Application No. 2019-538760 and is related to U.S. Appl. No. 16/624,760; with partial English language translation.

\* cited by examiner

F I G . 7
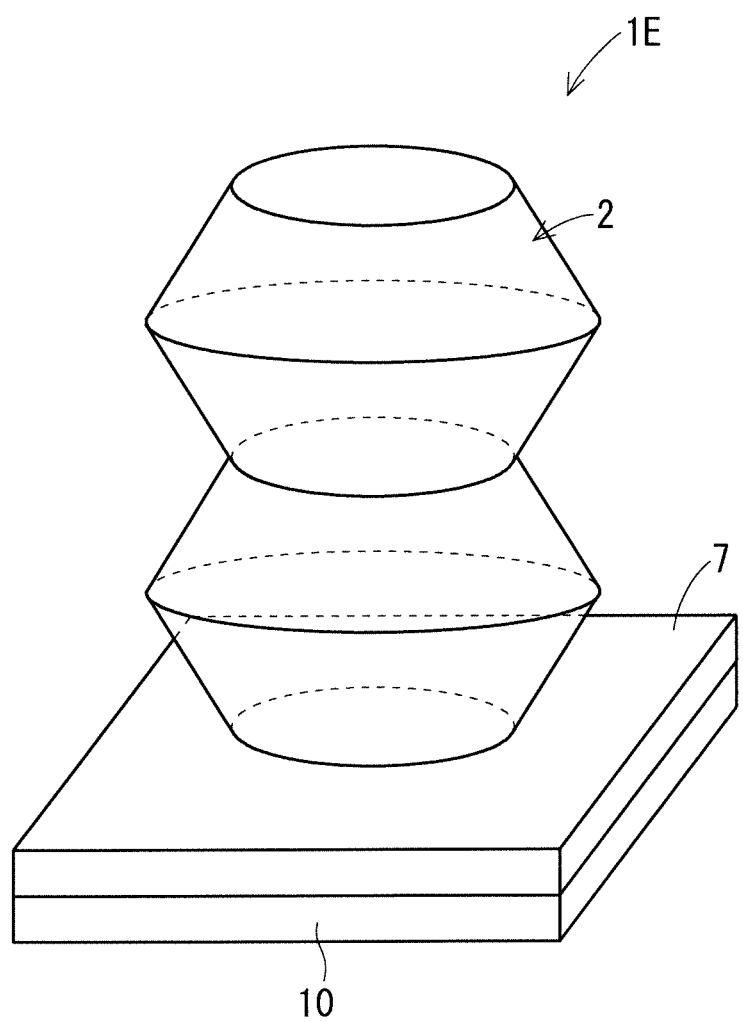

SPRING ELECTRODE

TECHNICAL FIELD

The present invention relates to a spring electrode for press-pack power semiconductor module which maintains an energized state while having flexibility in the vertical travel of press-pack power semiconductor chips.

BACKGROUND ART

For example, Patent Document 1 discloses a press-pack IGBT module that is a press-pack power semiconductor module (may be hereinafter referred to as a "semiconductor module"). The press-pack IGBT module includes a plurality of IGBTs that are press-pack power semiconductor chips (may be hereinafter referred to as "semiconductor chips"). The semiconductor chips obtain an electrical connection by being vertically compressed by a top electrode and a lower electrode.

Since pressure is uniformly applied to the plurality of semiconductor chips, each of the semiconductor chips needs a spring structure and play in a conducting path. The semiconductor chip includes a pressure pad for providing this play and ensuring the electrical connection. Although the semiconductor chip normally includes one pressure pad for increasing the current carrying capacity of the current, the semiconductor chip may include two pressure pads. Since a spring in the pressure pad functions as an inductance even with the electrical conductivity, the spring exhibits high impedance particularly with respect to a radio-frequency current. Moreover, a short-circuit current that is a radio-frequency current does not flow through the spring.

PRIOR ART DOCUMENT

Patent Document

[Patent Document 1] Japanese Unexamined Patent Application Publication No. 2004-528724

SUMMARY

Problem to be Solved by the Invention

It is feared that the press-pack IGBT modules may be damaged upon short circuit in the semiconductor chips. The press-pack IGBT modules are damaged because an electrical path in a module is broken, and arcing occurring in the break heats the module, which results in expansion of an atmosphere or vaporization of a solid object and causes an explosion.

The reasons why the electrical path in the module is broken upon a short circuit in a semiconductor chip are as follows. Upon a short circuit in the semiconductor chip, the short-circuit current flows through a pressure pad. Since the short-circuit current is a high current, the Joule heating caused by the short-circuit current dissolves the pressure pad, and breaks the electrical path to cause arcing. Particularly, since the short-circuit current is a radio-frequency current, it is feared that the short-circuit current concentrates on an edge portion of the pressure pad due to the skin effect and this portion gets hot and starts to be dissolved.

Thus, the press-pack IGBT modules require rugged explosion-proof structures which hinder the miniaturization and lower prices of the press-pack IGBT modules. Some press-pack IGBT modules need to limit use current areas, and separately need short-circuit protection.

The object of the present invention is to provide a technology that can prevent a spring electrode from being dissolved and broken upon a short circuit in a semiconductor chip.

Means to Solve the Problem

A spring electrode according to the present invention includes a main body that is a tubular conductor and varies in diameter in a longitudinal direction so that a side surface has bellows.

Effects of the Invention

A spring electrode according to the present invention includes a main body that is a tubular conductor and varies in diameter in a longitudinal direction so that a side surface has bellows. Since the main body of the spring electrode does not include an edge portion, the local concentration of a short-circuit current that flows through the spring electrode upon a short circuit in a semiconductor chip can be reduced. This can prevent the spring electrode from being dissolved and broken.

The object, features, aspects and advantages of the present invention will become more apparent from the following detailed description and the accompanying drawings.

BRIEF DESCRIPTION OF DRAWINGS

FIG. 7 is a perspective view illustrating that a spring electrode according to Embodiment 6 is disposed above a semiconductor chip.

DESCRIPTION OF EMBODIMENTS

[Premise Technology]

Figure 9:
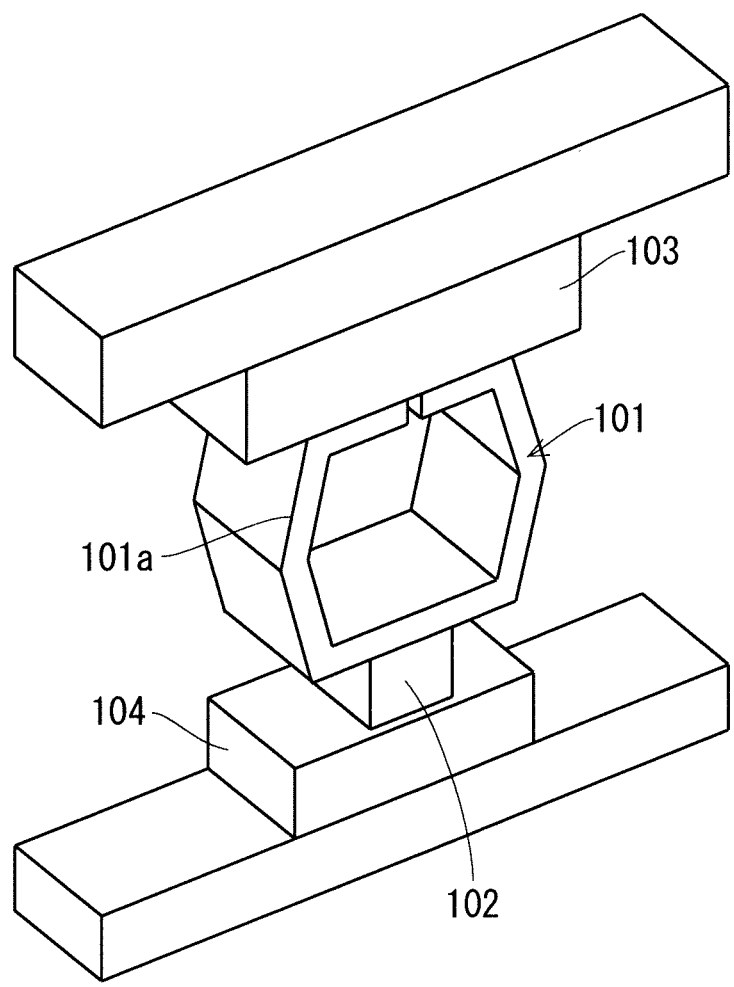
FIG. 9 is a perspective view illustrating that a spring electrode according to a premise technology is disposed between a top electrode and a lower electrode.
Figure 10:
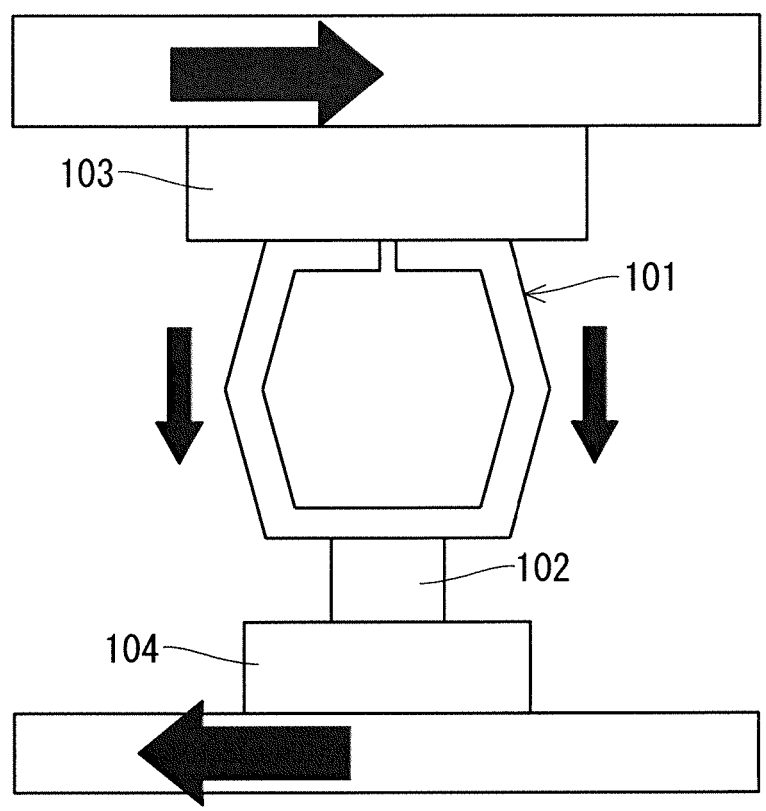
FIG. 10 is a front view illustrating that the spring electrode according to the premise technology is disposed between the top electrode and the lower electrode.

First, a spring electrode 101 according to a premise technology will be described. FIG. 9 is a perspective view illustrating that the spring electrode 101 according to the premise technology is disposed between a top electrode 103 and a lower electrode 104. FIG. 10 is a front view illustrating that the spring electrode 101 is disposed between the top electrode 103 and the lower electrode 104.

As illustrated in FIGS. 9 and 10, the spring electrode 101 is a conductor, and is shaped into, for example, a hexagon in a front view by folding a leaf spring in a direction orthogonal to a longitudinal direction. In other words, the spring electrode 101 is hexagonal in a front view. The top electrode 103 is disposed on a top surface with an upper side of the spring electrode 101. The lower side of the spring electrode 101 is disposed on a top surface of a semiconductor chip 102 mounted on the lower electrode 104. In other words, the spring electrode 101 is disposed between the top electrode 103 and the lower electrode 104.

Since the spring electrode 101 is formed by folding the leaf spring as described above, it includes an edge portion 101a. Here, the edge portion 101a is an edge connecting the principal surface to the side surface of the leaf spring. Upon a short circuit in the semiconductor chip 102, the short-circuit current flows in directions illustrated by arrows in FIG. 10. Since the short-circuit current is a radio-frequency current, the short-circuit current concentrates on the edge portion 101a of the spring electrode 101 due to the skin effect. This edge portion 101a gets hot and is dissolved according to the premise technology.

A spring electrode 1 according to Embodiment 1 solves such a problem, and will be described in detail below.

Embodiment 1

Figure 1:
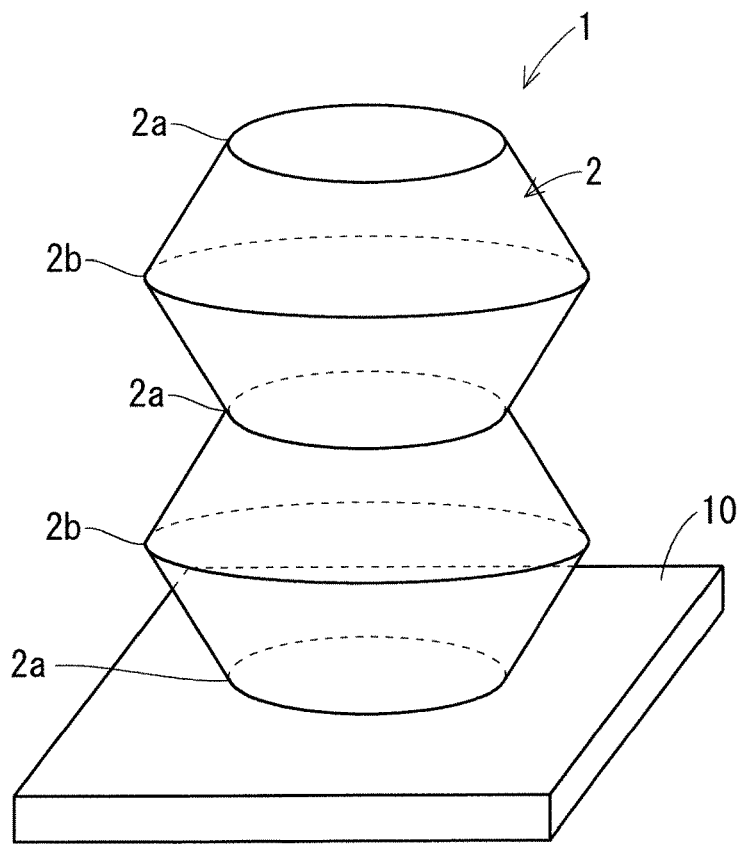
FIG. 1 is a perspective view illustrating that a spring electrode according to Embodiment 1 is disposed on a semiconductor chip.
Figure 2:
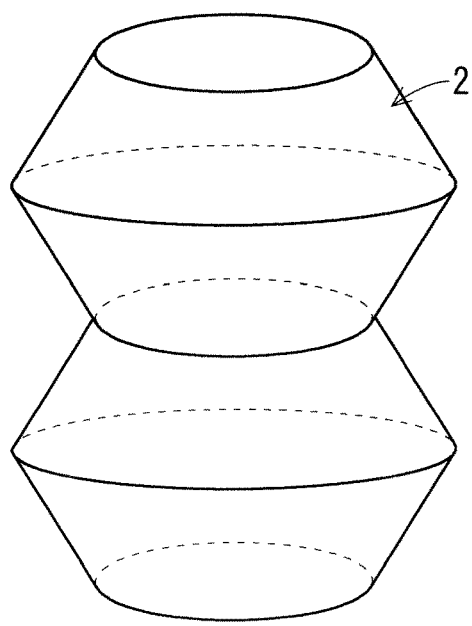
FIG. 2 is a perspective view of the spring electrode according to Embodiment 1.

Embodiment 1 of the present invention will be described with reference to the drawings. FIG. 1 is a perspective view illustrating that the spring electrode 1 according to Embodiment 1 is disposed on a semiconductor chip 10. FIG. 2 is a perspective view of the spring electrode 1 according to Embodiment 1.

As illustrated in FIG. 1, the spring electrode 1 is disposed on a top surface of the semiconductor chip 10 included in a semiconductor module (not shown), and disposed between a top electrode (not shown) and a lower electrode (not shown).

As illustrated in FIGS. 1 and 2, the spring electrode 1 includes a main body 2. The main body 2 is an elastic tubular conductor. The main body 2 varies in diameter in a longitudinal direction so that the side surface has bellows. Specifically, the main body 2 has a small-diameter portion 2a, a large-diameter portion 2b, the small-diameter portion 2a, the large-diameter portion 2b, and the small-diameter portion 2a in order from the top. In other words, the main body 2 is shaped into two successive lantern-like conductors. Since the main body 2 is tubular, the main body 2 is circular or oval in cross section.

The main body 2 may include one or three or more lantern-like conductors. Furthermore, the main body 2 may have the large-diameter portion 2b, the small-diameter portion 2a, and the large-diameter portion 2b in order from the top. Inserting insulating or conductive rings into joints of the main body 2, that is, the small-diameter portions 2a and the large-diameter portions 2b can increase the strength of the main body 2.

Since the main body 2 is disposed on the top surface of the semiconductor chip 10 and is disposed between the top electrode and the lower electrode, the semiconductor chip 10 obtains an electrical connection. Moreover, since the main body 2 is an elastic tubular conductor and has bellows, it can be vertically stretched and maintains its conducting capability. Since the main body 2 is vertically stretched, the semiconductor chip 10 vertically moves.

Since the short-circuit current is a radio-frequency current, it is feared that the current concentrates on, particularly, the edge portion 101a of the spring electrode 101 and this edge portion gets hot according to the premise technology. Since the main body 2 of the spring electrode 1 is tubular, the main body 2 is circular or oval in cross section according to Embodiment 1. Thus, the main body 2 does not include an edge portion, and the short-circuit current uniformly flows through the surface of the main body 2. Consequently, the main body 2 avoids the concentration of the short-circuit current, reduces the current density, and prevents increase in the temperatures. Thus, the dissolution of the spring electrode 1 can be avoided.

As described above, the spring electrode 1 according to Embodiment 1 includes the main body 2 that is a tubular conductor and varies in diameter in the longitudinal direction so that the side surface has bellows. Since the main body 2 of the spring electrode 1 does not include an edge portion, the local concentration of the short-circuit current that flows through the spring electrode 1 upon a short circuit in the semiconductor chip 10 can be reduced. This can prevent the spring electrode 1 from being dissolved and broken.

Thus, it is possible to prevent the arcing caused by a break in the spring electrode 1 upon a short circuit, and prevent an explosion caused by expansion of an atmosphere or vaporization of a solid object due to the arcing. Thus, semiconductor modules do not need any rugged explosion-proof structure, which can promote the miniaturization and lower prices of the semiconductor modules.

The main body 2 may include braided wires. This further increases the vertical mobility of the semiconductor chip 10.

Embodiment 2

Figure 3:
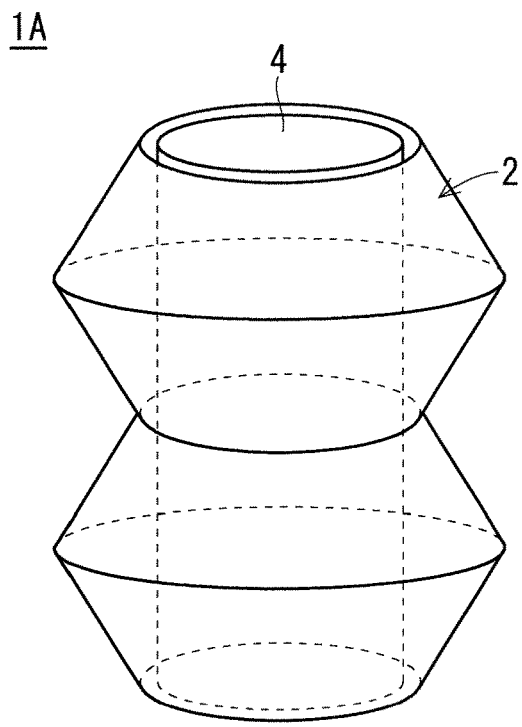
FIG. 3 is a perspective view of a spring electrode according to Embodiment 2.

Next, a spring electrode 1A according to Embodiment 2 will be described. FIG. 3 is a perspective view of the spring electrode 1A according to Embodiment 2. In Embodiment 2, the same reference numerals are assigned to the same constituent elements described in Embodiment 1, and the description thereof will be omitted.

As illustrated in FIG. 3, the spring electrode 1A includes the main body 2 and a spring 4 in Embodiment 2. The spring 4 is disposed inside the main body 2. The spring 4 may be as long as or shorter than the main body 2 in the longitudinal direction. The number of the spring 4 may be one. A plurality of the springs 4 may be arranged in a stacked manner in the vertical direction. The spring 4 is desirably a coiled spring.

As described above, since the spring electrode 1A according to Embodiment 2 further includes the spring 4 disposed inside the main body 2, the elastic force of the spring electrode 1A can be increased.

Embodiment 3

Figure 4:
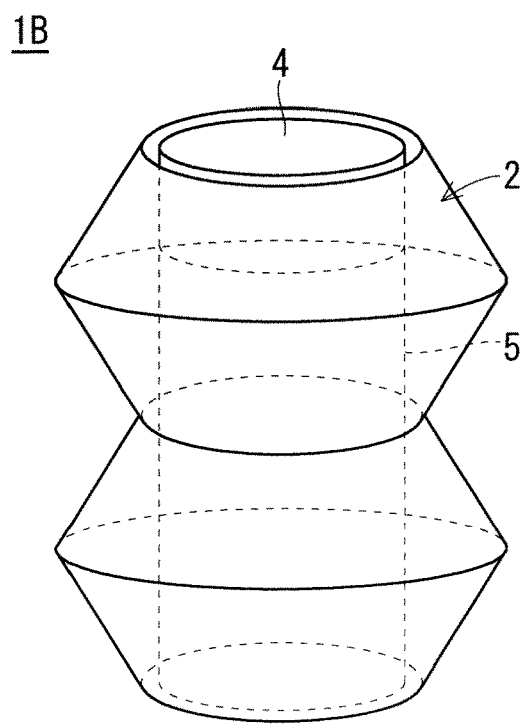
FIG. 4 is a perspective view of a spring electrode according to Embodiment 3.

Next, a spring electrode 1B according to Embodiment 3 will be described. FIG. 4 is a perspective view of the spring electrode 1B according to Embodiment 3. In Embodiment 3, the same reference numerals are assigned to the same constituent elements described in Embodiments 1 and 2, and the description thereof will be omitted.

As illustrated in FIG. 4, the spring electrode 1B includes the main body 2, the spring 4, and an insulating block 5 in Embodiment 3. The insulating block 5 is cylindrical and disposed inside the main body 2. The spring 4 is disposed above the insulating block 5 inside the main body 2. The spring 4 may be disposed below the insulating block 5 inside the main body 2.

As described above, since the spring electrode 1B according to Embodiment 3 further includes the insulating block 5 disposed above or below the spring 4 inside the main body 2, the travel of the spring 4 can be shortened. Consequently, a coned disc spring can be used as the spring 4.

Embodiment 4

Figure 5:
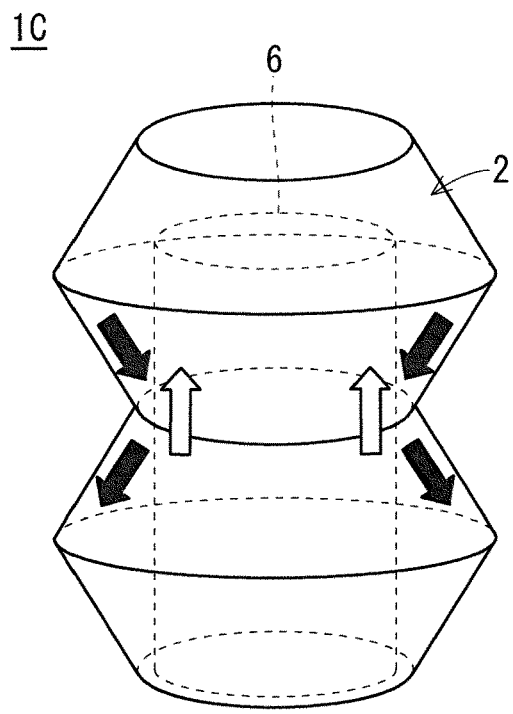
FIG. 5 is a perspective view of a spring electrode according to Embodiment 4.

Next, a spring electrode 1C according to Embodiment 4 will be described. FIG. 5 is a perspective view of the spring electrode 1C according to Embodiment 4. In Embodiment 4, the same reference numerals are assigned to the same constituent elements described in Embodiments 1 to 3, and the description thereof will be omitted.

As illustrated in FIG. 5, the spring electrode 1C includes the main body 2 and a conductive block 6 in Embodiment 4. The conductive block 6 is cylindrical and disposed inside the main body 2. The conductive block 6 is shorter than the main body 2 in the longitudinal direction. Space is provided above the conductive block 6 inside the main body 2. Space may be provided below the conductive block 6 inside the main body 2 with the upper portion of the conductive block 6 connected to the upper portion of the main body 2.

As indicated by the black arrows in FIG. 5, since the current entirely flows through the spring electrode 1C in the same direction, the forces pulling inside are generated as a whole. The forces pulling inside may break the spring electrode 1C and cause an electrical break, which may lead to arcing. Disposing the conductive block 6 inside the main body 2 allows an eddy current to flow through the surface of the conductive block 6 in a direction opposite to that of the short-circuit current due to the proximity effect as indicated by the open arrows in FIG. 5, and reduces the forces pulling inside. Thus, the damage of the spring electrode 1C can be prevented.

As described above, since the spring electrode 1C according to Embodiment 4 further includes the conductive block 6 disposed inside the main body 2, the eddy current flows through the conductive block 6 in the direction opposite to that of the short-circuit current. This relaxes an electromagnetic force produced in the spring electrode 1C, which can prevent the damage of the spring electrode 1C.

Embodiment 5

Figure 6:
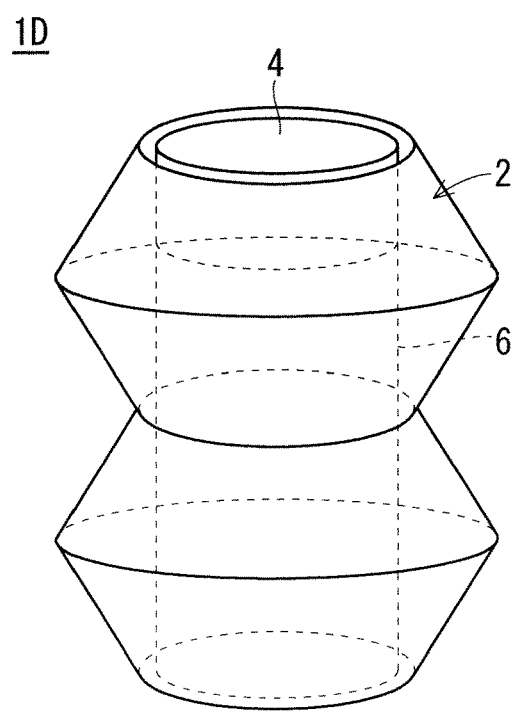
FIG. 6 is a perspective view of a spring electrode according to Embodiment 5.

Next, a spring electrode 1D according to Embodiment 5 will be described. FIG. 6 is a perspective view of the spring electrode 1D according to Embodiment 5. In Embodiment 5, the same reference numerals are assigned to the same constituent elements described in Embodiments 1 to 4, and the description thereof will be omitted.

As illustrated in FIG. 6, the spring electrode 1D includes the main body 2, the conductive block 6, and the spring 4 in Embodiment 5. The conductive block 6 is disposed inside the main body 2. The conductive block 6 is shorter than the main body 2 in the longitudinal direction. Space is provided above the conductive block 6 inside the main body 2. The spring 4 is disposed in the space above the conductive block 6 inside the main body 2. The spring 4 may be disposed in the space below the conductive block 6 inside the main body 2 with the upper portion of the conductive block 6 connected to the upper portion of the main body 2.

As described above, since the spring electrode 1D according to Embodiment 5 further includes the spring 4 disposed above or below the conductive block 6 inside the main body 2, the elastic force of the spring electrode 1D can be further increased.

Embodiment 6

Figure 8:
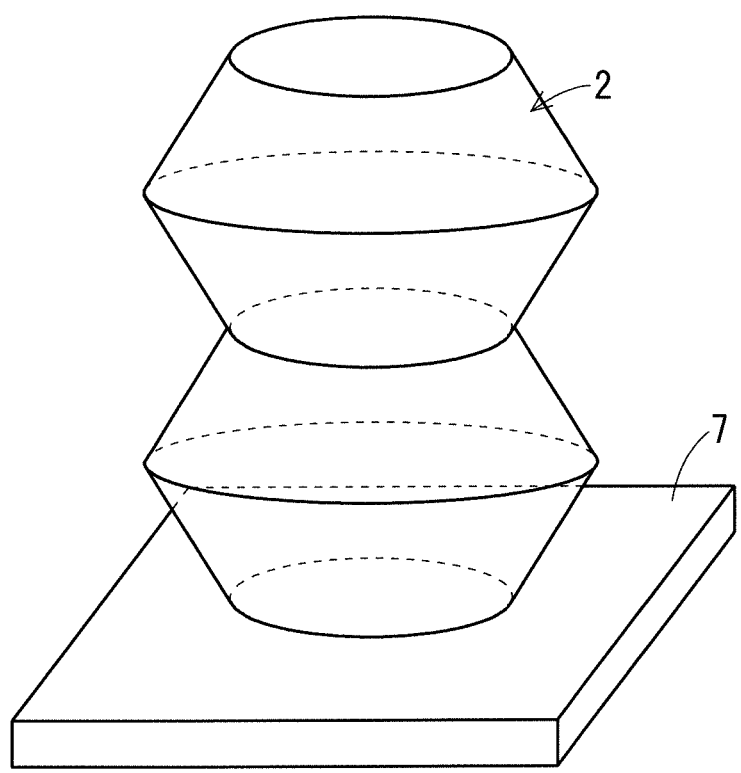
FIG. 8 is a perspective view of the spring electrode according to Embodiment 6.

Next, a spring electrode 1E according to Embodiment 6 will be described. FIG. 7 is a perspective view illustrating that the spring electrode 1E according to Embodiment 6 is disposed above the semiconductor chip 10. FIG. 8 is a perspective view of the spring electrode 1E. In Embodiment 6, the same reference numerals are assigned to the same constituent elements described in Embodiments 1 to 5, and the description thereof will be omitted.

As illustrated in FIGS. 7 and 8, the spring electrode 1E includes the main body 2 and a conductive plate 7 in Embodiment 6. The conductive plate 7 is disposed at the lower end of the main body 2, and can be in contact with the semiconductor chip 10. The contact surface of the conductive plate 7 with the semiconductor chip 10, that is, the lower surface of the conductive plate 7 is rectangular. Since the top surface of the semiconductor chip 10 is rectangular, the lower surface of the conductive plate 7 is identical in shape to the top surface of the semiconductor chip 10. The lower surface of the conductive plate 7 is identical in outline to the semiconductor chip 10 in a plan view. The conductive plate 7 may be disposed at the upper end of the main body 2, and the semiconductor chip 10 may be disposed on the upper surface of the conductive plate 7.

As described above, the spring electrode 1E according to Embodiment 6 is disposed at the upper end or the lower end of the main body 2, and further includes the conductive plate 7 which can be in contact with the semiconductor chip 10 and whose contact surface with the semiconductor chip 10 is rectangular. Since the contact surface of the conductive plate 7 with the semiconductor chip 10 is identical in shape to the semiconductor chip 10, the spring electrode 1E is easily connected with the semiconductor chip 10.

The contact surface of the conductive plate 7 with the semiconductor chip 10 is identical in outline to the semiconductor chip 10 in a plan view. Since the size of the conductive plate 7 is optimized and thus the size of the spring electrode 1E is optimized, the space in the semiconductor module can be effectively used.

Although the present invention is described in detail, the foregoing description is in all aspects illustrative and does not restrict the invention. Therefore, numerous modifications that have not yet been exemplified will be devised without departing from the scope of this invention.

Embodiments of the present invention can be freely combined, and appropriately modified or omitted within the scope of the present invention.

EXPLANATION OF REFERENCE SIGNS 1, 1A, 1B, 1C, 1D, 1E spring electrode, 2 main body, 4 spring, 5 insulating block, 6 conductive block, 7 conductive plate, 10 semiconductor chip.

The invention claimed is:
1. A spring electrode, comprising:
a hollow main body that is a tubular conductor and varies in diameter in a longitudinal direction so that a side surface has bellows; and
an element disposed inside the main body such that the element is surrounded by, and spaced apart from, the main body in a direction transverse to the longitudinal direction.
2. The spring electrode according to claim 1, wherein the main body includes braided wires.
3. The spring electrode according to claim 1, wherein the element is a spring.
4. The spring electrode according to claim 3, further comprising:
an insulating block disposed above or below the spring inside the main body.

5. The spring electrode according to claim 1, wherein the element is a conductive block.

6. The spring electrode according to claim 5, further comprising:
a spring disposed above or below the conductive block inside the main body.

7. The spring electrode according to claim 1, further comprising:
a conductive plate that is disposed at an upper end or a lower end of the main body and is configured to contact a semiconductor chip, wherein
a contact surface of the conductive plate is rectangular.

8. The spring electrode according to claim 7, wherein the contact surface of the conductive plate is identical in outline to the semiconductor chip in a plan view.

* * * * *